(12) United States Patent
Park et al.

(10) Patent No.: US 6,608,793 B2
(45) Date of Patent: Aug. 19, 2003

(54) EFFICIENT MANAGEMENT METHOD OF MEMORY CELL ARRAY

(75) Inventors: Yong Ha Park, Taegu (KR); Hoi Jun Yoo, Taejon (KR)

(73) Assignee: Korea Advanced Institute of Science and Technology (KR)

( * ) Notice: Subject to any disclaimer, the term of this patent is extended or adjusted under 35 U.S.C. 154(b) by 76 days.

(21) Appl. No.: 09/765,652

(22) Filed: Jan. 22, 2001

(65) Prior Publication Data

US 2001/0049767 A1 Dec. 6, 2001

(30) Foreign Application Priority Data

May 2, 2000 (KR) .......................... 2000-23569

(51) Int. Cl.[7] .............................. G11C 7/00; G11C 15/00
(52) U.S. Cl. .................. 365/230.03; 365/49; 711/3; 711/104; 711/128
(58) Field of Search ................ 365/49, 230.03, 365/230.01; 711/3, 104, 128, 202, 204

(56) References Cited

U.S. PATENT DOCUMENTS 5,657,469 A * 8/1997 Shimizu ........................ 711/118
5,774,409 A * 6/1998 Yamazaki et al. ....... 365/230.03

* cited by examiner

*Primary Examiner*—Son Mai
(74) *Attorney, Agent, or Firm*—Bacon & Thomas, PLLC

(57) ABSTRACT

The present invention relates to a method of efficiently managing a memory cell array. A new memory cell array management method of the present invention allows reduction of power consumption and improvement of performance of a memory system. In a method of efficiently managing a memory cell array according to the present invention, only some sub-word lines after activation of a main word line are activated, and then a window including a memory cell array connected with the activated sub-word lines is activated and managed. Then, a memory address region included in the window is mapped.

2 Claims, 4 Drawing Sheets

EFFICIENT MANAGEMENT METHOD OF MEMORY CELL ARRAY

BACKGROUND OF THE INVENTION

1. Field of the Invention

The present invention relates to a method of efficiently managing a memory cell array, and more particularly, a memory cell array management method for efficiently accessing a memory.

2. Description of the Related Art

Conventionally, in a DRAM memory operation, a memory row cycle operation during which the longest running time is spent is responsible for restraints of performance of the DRAM memory, and execution of a random row cycle causes deterioration in performance of the memory. For this reason, as a solution for minimizing a running time required for processing the random row cycle, an attempt to reduce the running time itself of the random row cycle and an attempt to substitute an operation on which a short running time is spent relatively for the memory row cycle operation on which the longest running time is spent have been made. A typical example of the former includes a sub-word line method in which in order to reduce a time needed for activating a word line occupying the most part among the running time of the random row cycle, a long word line is divided into various sub-word lines and an RC time constant is minimized to shorten a driving time (T. Sugibayashi, et al., "A 30 ns 256-Mb DRAM with a Multi divided Array Structure" IEEE Journal of Solid State Circuit, pp1092–1098. November, 1993 and T. Murotani, et al., "Hierarchical Word Line Architecture for Large Capacity DRAM" IEICE Trans. Electron., pp550–556, April, 1997).

In the meantime, examples of the latter includes a multi bank method in which a memory have a plurality of memory banks each being accessed and execution of each alternating with each other, an EDRAM (Enhanced DRAM) method in which an SRAM having a storage capacity of one page is disposed around a memory sense amplifier, and if there occurs a cache hit, a row cycle is removed to accomplish improvement in performance of a memory, a CDRAM (Cache DRAM) method in which an SRAM for performing a high speed operation is integrated with a DRAM, and if there occurs a cache hit, the row cycle is removed.

However, in the above mentioned methods, for a DRAM, as its storage capacity is increased, a capacity of a cell included in the identical memory bank is increased, particularly, an increase in capacity of a memory cell activated by one word line leads to a unnecessary increase of an activated page, which is a main fact of power consumption.

Such problems can be found from Table 1.

| *8, 4 Bank | Row Add | Bank Add | Col Add | Operating Current* |
|---|---|---|---|---|
| 64 Mb | RA0–RA11 | BA0, BA1 | CA0–CA8 | 95 mA–115 mA |
| 128 Mb | RA0–RA11 | BA0, BA1 | CA0–CA9 | 115 mA–150 mA |
| 256 Mb | RA0–RA12 | BA0, BA1 | CA0–CA9 | 115 mA–140 mA |

As shown in Table 1, it can be more apparently seen that a current consumption according to an increase of a column address is greater than that according to an increase of a row address.

SUMMARY OF THE INVENTION

Therefore, the present invention has been made in view of the above-mentioned problems, and it is an object of the present invention to provide a method of efficiently managing a memory cell array in which deterioration in performance of a memory is prevented in the process of executing a random row cycle.

Another object of the present invention is to provide a method of efficiently managing a memory cell array in which performance of a memory system is improved by reducing the frequency itself of generation of a random row cycle requiring a long running time.

Another object of the present invention is to provide a method of efficiently managing a memory cell array in which a unnecessary activation of a sense amplifier is prevented to reduce a power consumption of a memory system, thereby improving efficiency in operation and performance of the memory system.

In order to achieve the above objects, the present invention is characterized in that four memory cell array management method, i.e., a partial segment activation method, an adaptive window control method, an associative mapping method, and an enhanced bank interleaving method are used respectively, or a combination of them is used, thereby reducing a power consumption and improving performance of a memory system. That is, in management of the memory cell array, an upper level operation type using a segment as a unit is employed.

In a method of efficiently managing a memory cell array according to the present invention, only some sub-word lines after activation of a main word line are activated, and then a window including a memory cell array connected with the activated sub-word lines is activated and managed. Then, a memory address region included in the window is mapped.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENT

Reference will now be made in detail to the preferred embodiments of the present invention. In the following description of the present invention, the detailed description of known functions and configurations incorporated herein will be omitted when it may make the subject matter of the present invention rather unclear.

Figure 1:
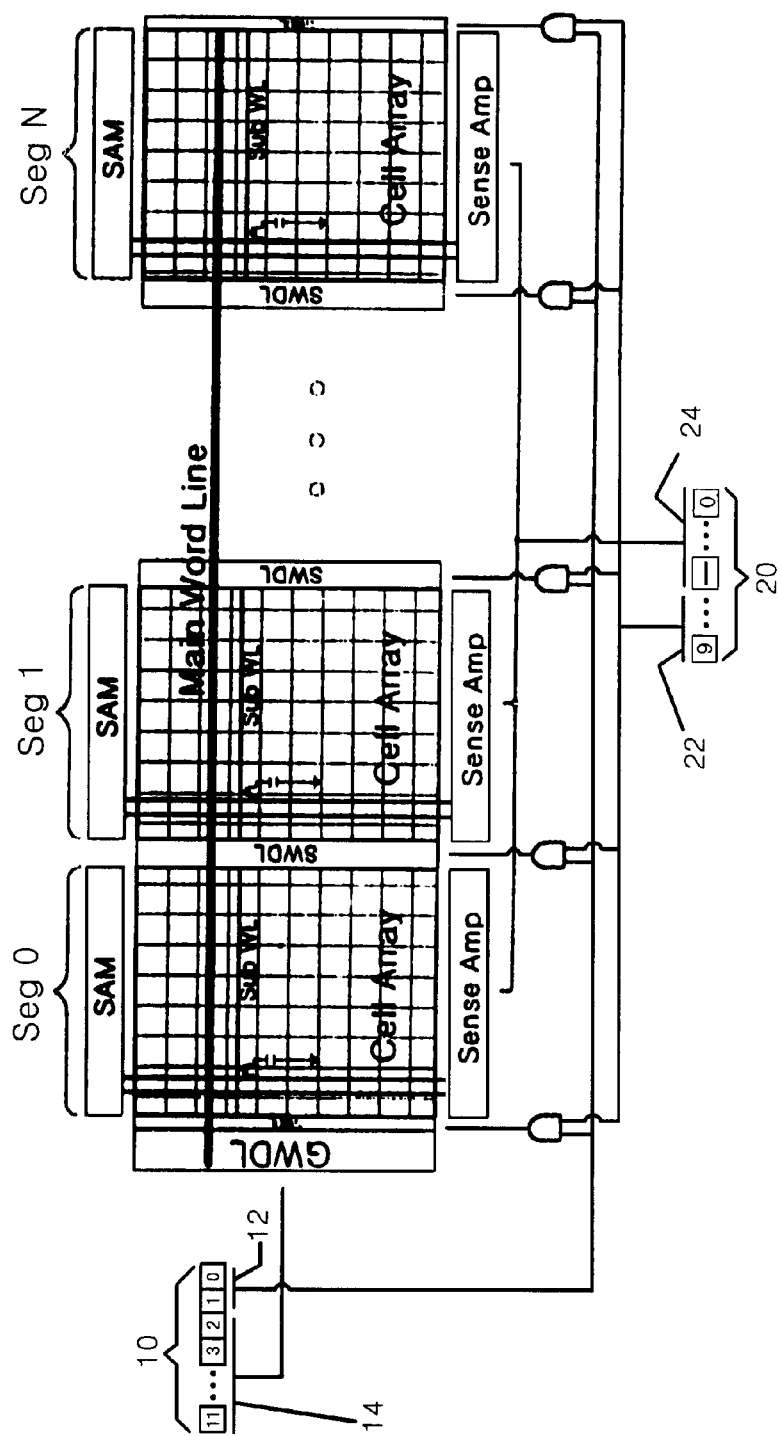
FIG. 1 is a view illustrating a memory segment arrangement for explaining a process of a partial segment activation according to a preferred embodiment of the present invention.

FIG. 1 is a view illustrating a memory segment arrangement for explaining a process of a partial segment activation according to a preferred embodiment of the present invention.

As shown in FIG. 1, a semiconductor memory includes N+1 memory cell arrays separated from each other by using a segment as a unit, N+1 sense amplifiers each connected to an associated one of the N+1 memory cell arrays, a plurality of bit lines and a plurality of word lines adapted to constitute each of the N+1 memory cell arrays and to input/output information to/from each of a plurality of memory cells arranged at intersections of the plurality of bit lines and the plurality of word lines, a main word line adapted to select the N+1 memory cell arrays under the control of a row address 14, a sub-word line adapted to select a predetermined one of the N+1 memory cell arrays, a row address 12 and a column address 22 adapted to control selection of the predetermined memory cell array of the sub-word line, and an and gate adapted to supply a control signal to each of the N+1 memory cell arrays and connected with the row address 12 and the column address 22.

Now, an operation of the semiconductor memory having such a construction will be described hereinafter.

First, the main word line is activated by the remaining high order bits 14 except two low order bits 12 of the row address 10, and only sub-word lines included in some segments is activated by a combination of the two low order bits 12 of the row address 10 and high order bits 22 of a column address 20. That is, in such a structure of the semiconductor memory, both the row address 10 and the column address 20 are decoded to activate only sub-word lines of desired segments so that a selective control of the column address is performed. Since an important decisive factor when selecting the sub-word line is a column address, it can be considered to be the column address 20. Like this, an activation page is limited to only some of the segments, but not all the address regions which the column address 20 can control so that the number of the sense amplifiers that can be operated at one time is reduced to secure a low electric power operation.

Figure 2:
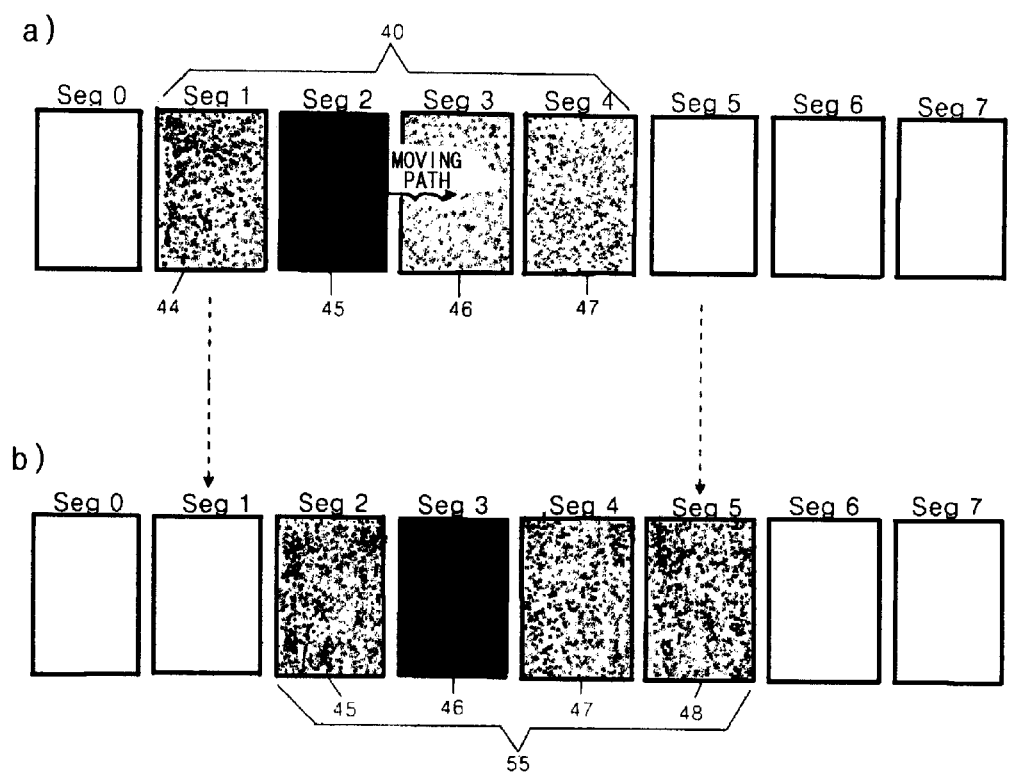
FIG. 2 is a view illustrating an adaptive window control method according to a preferred embodiment of the present invention.

FIG. 2 is a view illustrating an adaptive window control mode according to a preferred embodiment of the present invention.

As shown in FIG. 2, a window is composed of the plurality of memory cell arrays separated by using a segment as a unit and a part of the memory cell array.

An adaptive window control operation of the present invention will be described in detail hereinafter.

A window 40 is established to include additional activation segments 44, 46 and 47 within an permissible range of a power margin in addition to a currently activated segment 45 and the window 40 is managed so that there is increased a possibility of incorporating a segment 46 to be activated next in a window 55. In FIG. 2, it has been supposed that memory cells included in four segments (44,45,46 and 47, or 45,46,47 and 48) constitute one page. Three segments 44, 46 and 47 are activated by the column address along with the activated segment 45 to reduce page miss, and a segment 44 of the three segments 44, 46 and 47 is inactivated according to a shift of a window. Also, the segment 48 is a segment activated newly by the window shift. In FIG. 2(a) and FIG. 2(b), when an address number is increased sequentially, if a new window 55 is established and activated previously based on a new column address even if the next column access exists in a currently activated window 40 so that there occurs a window hit requiring the next memory region, the size of the newly activated segment 48 always becomes less than the size of the window so that a power consumption is minimized while maintaining an identical expectation for the window hit. Particularly, in a process of data generated while a column address is increased or decreased sequentially in an existing activation page, only prediction using simple history bit shows a hit rate of 90%. The row addresses are identical, but if there occurs a window miss due to a difference in column addresses, since a pre-charge of the currently activated window 40 and the segment 46 to be activated next can allow repetition of a driving of the sub-word line, a time needed for a pre-charge can be saved. Besides this, when the adaptive window control mode is used along with the above partial segment activation mode, a diverse adaptive window control algorithm can manage the sub-word lines so that a power consumption is reduced while inducing an efficient operation of the semiconductor memory. Therefore, the adaptive window control operation can be applied as a method of overcoming a reduction in the size of an activation page as mentioned above as a disadvantage when employing the partial segment activation. When the size of an activation page is reduced, a column address region enabling a high-speed operation is also reduced, thereby preventing a deterioration in performance of the memory.

FIG. 3 is a view illustrating a region which an activation window occupies in a memory address space in an associative mapping method according to a preferred embodiment of the present invention.

Figure 3A:
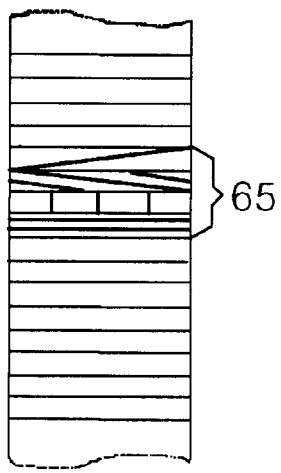
FIGS. 3a and 3b are views illustrating a region which an activation window occupies in a memory address space in an associative mapping method according to a preferred embodiment of the present invention.
Figure 3B:
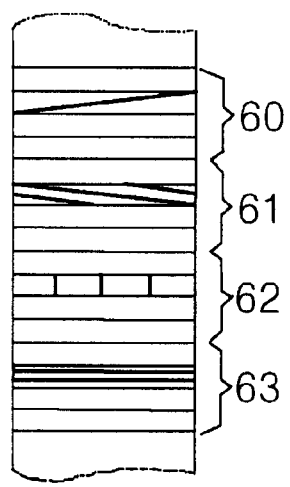

As shown in FIG. 3, the associative mapping method is a sub-word line management method which can be used together with the adaptive window control method. For a method of improving a hit rate using the associative mapping method, only prediction using the above history bit shows a high hit rate for a successive approach occurred within a conventional activation page. As a result, even a great reduction in the size of the window for this portion does not affect the whole performance of the memory due to a pre-fetch through a window prediction. Therefore, if the size of the window used in the adaptive window control method is reduced to 1/N, N windows having a certain offset can be utilized on the identical activation page. Like this, an address region established as an activation window 65 which does not undergo the associative mapping process as shown in FIG. 3a and activation windows 60, 61, 62 and 63 undergoing the associative mapping process by four groups using two high order bits of the row address as shown in FIG. 3b are shown on a memory address space. In the case of FIG. 3b, the activation windows 60, 61, 62 and 63 can cope with actively an address jump operation occurring on a memory address within the identical page.

In addition, in the case of using a method of combining the partial segment activation method with the adaptive window control method among the efficient memory cell array management methods, that is, in order to reduce a power consumption which may be generated in the process of activating all the segments at one time when activating a plurality of segments included in a window, if the partial segment activation method is applied which activates the segments several times bit by bit, an excessive flow of instantaneous current is suppressed so that a noise caused due to a variation in a ground or a power line can be minimized. The partial segment activation method can also applied to a general sub-word line activation process except a window-based segment structure.

Figure 4:
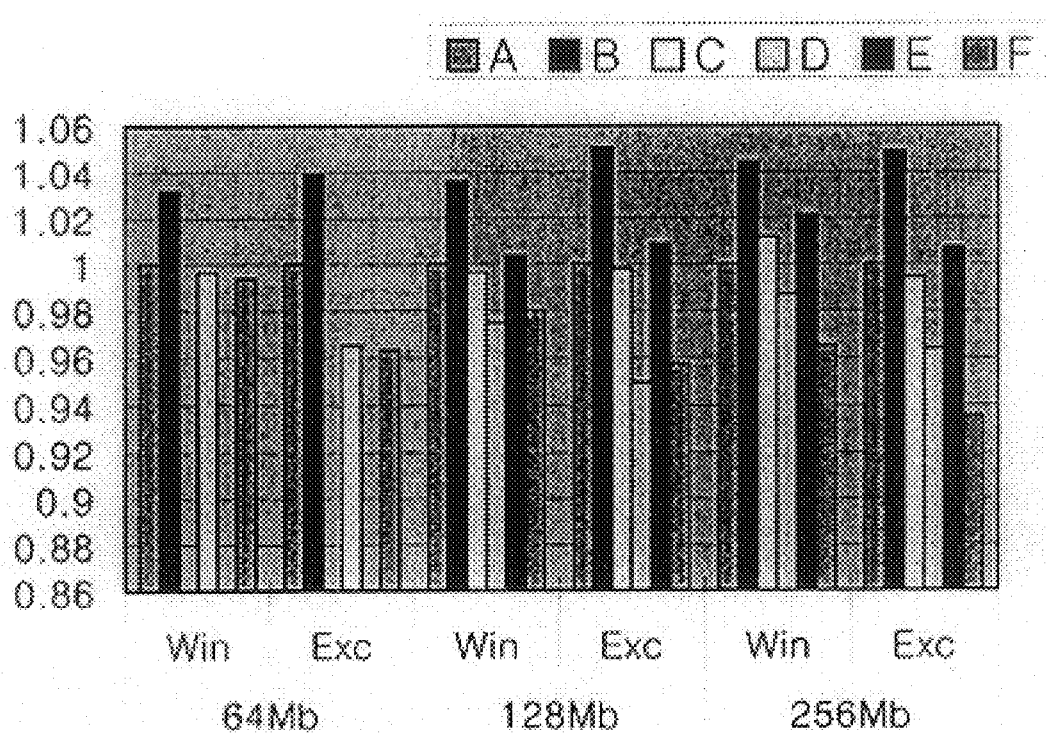
FIG. 4 is a graph illustrating results of comparison between performances according to memory capacities to which various methods of the present invention are applied.

FIG. 4 is a graph illustrating results of comparison between performances according to memory capacities to which various methods of the present invention are applied.

Referring to FIG. 4, addresses generated during a window booting process and an excel execution process for each of memory capacities of 64 MB/128 MB/256 MB are extracted by using a PC emulator and a hardware (H/W) structure simulator for verification of performance, and the extracted addresses are applied to a memory composed of a selective combination of a partial segment activation mode, an adaptive window control mode, an enhanced bank interleaving mode, etc. As a result, in the case of using the partial segment activation mode, a deterioration in performance of only 5% has resulted in for an expectation for a reduction in power of 30% or so, and in a structure of combining the partial segment activation mode, an adaptive window control mode, and an enhanced bank interleaving mode, an improvement in performance of 2–7% has resulted in. It can be seen from the graph of FIG. 4, that the greater the memory capacity becomes, the more an improvement in performance of the memory becomes prominent. Experimental data which is a basis of a graph of FIG. 4 is specified in Table 2.

| | | Simulation condition (*8 structure) | | |
|---|---|---|---|---|
| Division | Capacity Scheme | 64 Mb | 128 Mb | 256 Mb |
| A | SDRAM | 4K, 4Bank | 8K, 4Bank | 8K, 4Bank |
| B | PSA | 2K, 4Bank | 2K, 4Bank | 2K, 4Bank |
| C | PSA + EBI (50%) | | 2K, 8Bank | 2K, 8Bank |
| D | PSA + EBI (100%) | 2K, 8Bank | 2K, 16Bank | 2K, 16Bank |
| E | PSA + AWC + EBI (50%) | | 2K, 8Bank | 2K, 8Bank |
| F | PSA + AWC + EBI (100%) | 2K, 8Bank | 2K, 16Bank | 2K, 16Bank |

An enhanced bank interleaving mode as one of efficient DRAM column management methods will be described in detail hereinafter.

In the enhanced bank interleaving mode, unlike a case of placing special emphasis on a low power operation as a cause of deterioration in performance generated in the partial segment activation mode by applying the adaptive window control mode and the associative mapping mode to the efficient DRAM column management method while maintaining the number of banks in a level similar to a conventional case, performance of a memory is improved by a bank interleaving method while maintaining a power consumption in a level similar to a conventional case by relating a power margin generated in an activation page reduced by the partial segment activation mode with an increase in the number of additional banks. As a result, an erroneous operation of conventional DRAMs due to an additional excessive current generated according to an increase in the number of banks is prevented easily. Also, the enhanced bank interleaving mode is used along with various efficient memory cell array management methods so that the memory cell array can be managed more efficiently.

Various embodiments of the efficient memory cell array management methods used together with the enhanced bank interleaving mode will be described hereinafter in detail.

As embodiment 1 of the enhanced bank interleaving mode, in a method of managing a memory cell array including a plurality of memory banks, a main word line is activated by information on the remaining bits except information on some bits of a row address within a certain memory bank among the plurality of memory banks, and then only sub-word lines included in desired segments are activated by decoding a combination of the information of some bits of the row address and information on some bits of a column address. After that, a memory bank except the activated certain memory bank is selected to activate the main word line by information on the remaining bits except information on some bits of a row address, and to activate only sub-word lines included in desired segments by decoding a combination of the information on some bits of the row address within the selected memory bank and information on some bits of a column address, thereby efficiently managing a memory column.

As embodiment 2 of the enhanced bank interleaving mode, in a method of managing a memory cell array including a plurality of memory banks, a main word line is activated by information on the remaining bits except information on some bits of a row address within a certain memory bank among the plurality of memory banks, and then only sub-word lines included in desired segments are activated by decoding a combination of the information of some bits of the row address and information on some bits of a column address. Then, a window including other segments adjacent to a currently activated segment is established, and whether or not there occurs a window hit for a segment to be activated next in the established window is determined. At this time, a new window including other segments adjacent to the segment to be activated next is established on the basis of the segment to be activated next if it is determined that there occurs the window hit for the segment to be activated next. Also, a memory bank except the activated certain memory bank is selected to activate only sub-word lines included in desired segments, to establish a window including other segments adjacent to a currently activated segment, and to determine whether or not there occurs a window hit for a segment to be activated next in the established window as mentioned above within the selected memory bank. At this time, a new window including other segments adjacent to the segment to be activated next is established on the basis of the segment to be activated next if it is determined that there occurs the window hit for the segment to be activated next, thereby efficiently managing a memory column.

As embodiment 3 of the enhanced bank interleaving mode, in a method of managing a memory cell array including a plurality of memory banks, a window for activating predetermined ones of the plurality of the segments within a certain memory bank among the plurality of memory banks is established for activation of the window, and then whether or not there occurs a window hit for a segment to be activated next in the established window is determined. At this time, a new window including other segments adjacent to the segment to be activated next is established by using a mapping on the basis of the segment to be activated next if it is determined that there occurs the window hit for the segment to be activated next. Also, a memory bank except the activated certain memory bank is selected to establish a window for activation of the window, to establish a window including other segments adjacent to a currently activated segment, and to determine whether or not there occurs a window hit for a segment to be activated next in the established window as mentioned above within the selected memory bank. At this time, a new window including other segments adjacent to the segment to be activated next is established by using a mapping on the basis of the segment to be activated next if it is determined that there occurs the window hit for the segment to be activated next, thereby efficiently managing a memory column.

As embodiment 4 of the enhanced bank interleaving mode, in a method of managing a memory cell array including a plurality of memory banks, when activating the predetermined number of ones of the plurality of the segments, the number of segments less than the predetermined number of segments are grouped into one operating unit to form a plurality of units within a certain memory bank among the plurality of memory banks, and then the formed plurality of units are activated sequentially by using a partial segment activation mode. Also, a memory bank except the activated certain memory bank is selected to group the number of segments less than the predetermined number of segments into one operating unit to form a plurality of units within a certain memory bank among the plurality of memory banks, and to sequentially activate the formed plurality of units by using a partial segment activation mode when activating the predetermined number of ones of the plurality of the segments as mentioned above within the selected memory bank, thereby efficiently managing a memory column.

As can be seen from the foregoing, according to a memory cell array management method of present invention, a low power operation of a semiconductor memory device is possible through a partial segment activation mode, an adaptive window control mode, an associative mapping mode, and an enhanced bank interleaving mode, and it is possible to improve performance of a semiconductor memory device. More specifically, the technology relating to a semiconductor memory device is following a continuing trend toward increased storage capacity, since an appearance of 64 MB DRAM. Moreover, attention is paid to a technology for implementing a low power and high performance of a memory besides a design method of a memory core which has been used until now. Therefore, if diversified memory column management methods using a combination of a partial segment activation (PSA) mode, an adaptive window control (AWC) mode, an associative mapping (ASM) mode, and enhanced bank interleaving (EBI) mode are implemented, it is possible to achieve a low-power and a high-efficient memory by combining the diversified memory column management methods with DDR DRAM or RDRAM INTERFACE which is available now on the market, or which is expected to be used as a memory structure for EML as well as a standard of the next-generation DRAM.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

What is claimed is:

1. A method of efficiently managing a memory cell array by using an adaptive window control mode, wherein the memory cell array is divided into a plurality of segments as units, and each of a plurality of word lines included in each of the plurality of segments is driven by a corresponding sub-word line driver, comprising the steps of:

activating a main word line by information on the remaining bits except information on some bits of a row address, and then activating only sub-word lines included in desired segments by decoding a combination of the information on some bits of the row address and information on some bits of a column address;

establishing a window including other segments adjacent to a currently activated segment;

determining whether or not there occurs a window hit for a segment to be activated next in the established window; and establishing a new window including other segments adjacent to the segment to be activated next on the basis of the segment to be activated next if it is determined that there occurs the window hit for the segment to be activated next.

2. A method of efficiently managing a memory cell array by using an associative mapping mode, wherein the memory cell array is divided into a plurality of segments as units, and the plurality of segments are connected with a main word line, comprising the steps of:

establishing a window for activating predetermined ones of the plurality of the segments for activation of the window;

determining whether or not there occurs a window hit for a segment to be activated next in the established window; and establishing a new window including other segments adjacent to the segment to be activated next using a mapping on the basis of the segment to be activated next if it is determined that there occurs the window hit for the segment to be activated next.

* * * * *